US011309362B2

(12) United States Patent
Wang et al.

(10) Patent No.: US 11,309,362 B2
(45) Date of Patent: Apr. 19, 2022

(54) DISPLAY PANEL, DISPLAY APPARATUS, AND MANUFACTURING METHOD THEREOF

(71) Applicant: BOE TECHNOLOGY GROUP CO., LTD., Beijing (CN)

(72) Inventors: Youwei Wang, Beijing (CN); Song Zhang, Beijing (CN); Peng Cai, Beijing (CN); Chunyan Xie, Beijing (CN); Huan Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 484 days.

(21) Appl. No.: 16/346,229

(22) PCT Filed: Oct. 19, 2018

(86) PCT No.: PCT/CN2018/110995
§ 371 (c)(1),
(2) Date: Apr. 30, 2019

(87) PCT Pub. No.: WO2019/200862
PCT Pub. Date: Oct. 24, 2019

(65) Prior Publication Data
US 2021/0359035 A1 Nov. 18, 2021

(30) Foreign Application Priority Data
Apr. 17, 2018 (CN) .......................... 201810344535.9

(51) Int. Cl.
*H01L 27/15* (2006.01)
*H01L 27/32* (2006.01)
(52) U.S. Cl.
CPC .... *H01L 27/3223* (2013.01); *H01L 2227/323* (2013.01)

(58) Field of Classification Search
CPC ... H01L 27/32; H01L 27/3223; H01L 51/525; H01L 51/5253; G02F 1/13394
(Continued)

(56) References Cited

U.S. PATENT DOCUMENTS

2015/0090982 A1* 4/2015 Lin ................... H01L 27/3246
257/40
2016/0011444 A1* 1/2016 Xie ..................... G02F 1/1339
349/153
(Continued)

FOREIGN PATENT DOCUMENTS

CN 101340750 A 1/2009
CN 103943663 A 7/2014
(Continued)

OTHER PUBLICATIONS

International Search Report dated Dec. 21, 2018, issued in counterpart Application No. PCT/CN2018/110995 (4 pages).
(Continued)

*Primary Examiner* — Brook Kebede
(74) *Attorney, Agent, or Firm* — WHDA, LLP

(57) ABSTRACT

The present disclosure relates to a display panel. The display panel may include a substrate. The substrate may include a display area, a dummy area inside the display area, and a boundary area between the dummy area and the display area on the substrate. The display substrate may further include an isolation protrusion on the substrate at the boundary area. The isolation protrusion may be configured to isolate a functional layer in the display area from the functional layer in the dummy area, and at least a side surface of the isolation protrusion facing the dummy area may be covered by an isolation inorganic layer.

20 Claims, 10 Drawing Sheets

(58) Field of Classification Search
USPC .......................................................... 257/79
See application file for complete search history.

(56) References Cited

U.S. PATENT DOCUMENTS

2016/0226018 A1* 8/2016 Akagawa ............ H01L 51/5246
2018/0321536 A1* 11/2018 Hu .................... G02F 1/133514

FOREIGN PATENT DOCUMENTS

| CN | 106406590 A | 2/2017 |
|----|-------------|--------|
| CN | 106409867 A | 2/2017 |
| CN | 107248374 A | 10/2017 |
| CN | 107452894 A | 12/2017 |
| CN | 108574054 A | 9/2018 |

OTHER PUBLICATIONS

Office Action dated Mar. 22, 2019, issued in counterpart CN Application No. 201810344535 9, with English translation (19 pages).

Office Action dated Jun. 27, 2019, issued in counterpart CN Application No. 201810344535.9, with English translation (14 pages).

Office Action dated May 13, 2019, issued in counterpart CN Application No. 201810344535.9, with English translation (17 pages).

Office Action dated Sep. 5, 2019, issued in counterpart CN Application No. 201810344535.9, with English translation (11 pages).

* cited by examiner

DISPLAY PANEL, DISPLAY APPARATUS, AND MANUFACTURING METHOD THEREOF

CROSS-REFERENCE TO RELATED APPLICATIONS

This application claims benefit of the filing date of Chinese Patent Application No. 201810344535.9 filed on Apr. 17, 2018, the disclosure of which is hereby incorporated in its entirety by reference.

TECHNICAL FIELD

The present disclosure relates to display technologies and, in particular, to a display panel, a display apparatus, and a manufacturing method thereof.

BACKGROUND

With the development of display technology, Organic Electroluminescence Display (OLED) apparatus has become one of mainstream products in display field due to its features such as self-illumination, high brightness, high contrast, low operating voltage, and flexible display, etc.

The display apparatus in the related art can realize design of an opening on a portion of back plate of a flexible OLED screen through a mask patterning scheme. However, the functional layer including an electroluminescence (EL) layer is a continuous unitary layer in the display apparatus. If a laser cutting is directly used for obtaining the opening, the EL layer will be directly exposed to the air. As such, the material of the EL layer will lead to ingress of moisture and accordingly failure of the encapsulation.

BRIEF SUMMARY

An embodiment of the present disclosure provides a display substrate. The display substrate may include a substrate. The substrate may include a display area, a dummy area inside the display area, and a boundary area between the dummy area and the display area on the substrate. The substrate may further include an isolation protrusion on the substrate at the boundary area. The isolation protrusion may be configured to isolate a functional layer in the display area from the functional layer in the dummy area and at least a side surface of the isolation protrusion facing the dummy area may be covered by an isolation inorganic layer.

The functional layer may include at least one of a light-emitting layer, a cathode, or a capping layer. The isolation inorganic layer may be formed by atomic layer deposition. In one embodiment, the isolation protrusion comprises a wall structure surrounding the dummy area. In one embodiment, the isolation protrusion comprises a plurality of isolation columns surrounding the dummy area. A distance between two adjacent isolation columns may be in a range of about 30 μm to about 100 μm.

An orthographic projection of the lower half of the isolation protrusion on the substrate may fall within an orthographic projection of the upper half of the isolation protrusion on the substrate. An area of a cross-section of the isolation protrusion in a plane parallel to the substrate may increase along a direction away from the substrate. In one embodiment, a cross-section of the isolation protrusion in a plane perpendicular to the substrate has an inverted trapezoidal structure. In one embodiment, a cross-section of the isolation protrusion in a plane perpendicular to the substrate has a stepwise structure.

The isolation protrusion may include a polyimide material. The isolation inorganic layer may include silicon oxide or aluminum oxide. The isolation inorganic layer may have a thickness in a range of about 10 nm to about 50 nm. The isolation inorganic layer may extend into at least a part of the display area.

The display substrate may further include an encapsulation layer covering at least the display area and the boundary area. The encapsulation layer may include a first inorganic layer, an organic layer, and a second inorganic layer. The first inorganic layer may cover at least the display area and the boundary area, the organic layer may cover at least the display area, and the second inorganic layer may cover at least the display area and the boundary area. An orthographic projection of the organic layer may fall within an orthographic projection of the first inorganic layer and an orthographic projection of the second inorganic layer.

The dummy am may include a hole, and a shortest distance from an edge of the hole to an edge of the display area may be in a range of about 0.5 mm to about 2 mm.

Another example of the present disclosure is a display apparatus. The display apparatus may include the display substrate according to one embodiment of the present disclosure. The dummy area may be configured to install at least one selected from a group consisting of a camera, a sensor, and a physical button.

Another example of the present disclosure is a method of manufacturing a display apparatus. The method may include forming an isolation protrusion on a substrate of the display apparatus, the isolation protrusion being configured to isolate a display area from a dummy area inside the display area of the display apparatus, forming an isolation inorganic layer on a surface of the isolation protrusion facing the dummy layer, and forming a functional layer in the display area and the dummy area respectively. The isolation protrusion may isolate the functional layer in the display area from the functional layer in the dummy area.

The method may further include forming an encapsulation layer on the functional layer of the display area and the functional layer of the non-display area. The encapsulation layer may include a first inorganic layer, an organic layer, and a second inorganic layer. The first inorganic layer may cover at least the display area and the boundary area, the organic layer may cover at least the display area, and the second inorganic layer may cover at least the display area and the boundary area. An orthographic projection of the organic layer may fall within an orthographic projection of the first inorganic layer and an orthographic projection of the second inorganic layer.

The first inorganic layer may be formed by a chemical vapor deposition technique, the organic layer may be formed by an ink-jet printing technique, and the second inorganic layer may be formed by a chemical vapor deposition technique.

The method may further include forming a hole in the dummy area by laser or mechanical force. The method may further include installing a sensor, a camera, or a physical button in the hole. The functional layer may be formed in the display area and the dummy area respectively by an evaporation deposition technique.

BRIEF DESCRIPTION OF THE DRAWINGS

In order to more clearly illustrate the embodiments of the present disclosure or the technical solutions in the prior art, the drawings used in the embodiments or the description of the prior art will be briefly described below. Obviously, the drawings in the following description are only certain embodiments of the present disclosure, and other drawings can be obtained from those skilled in the art without any creative work.

DETAILED DESCRIPTION

Figure 1:
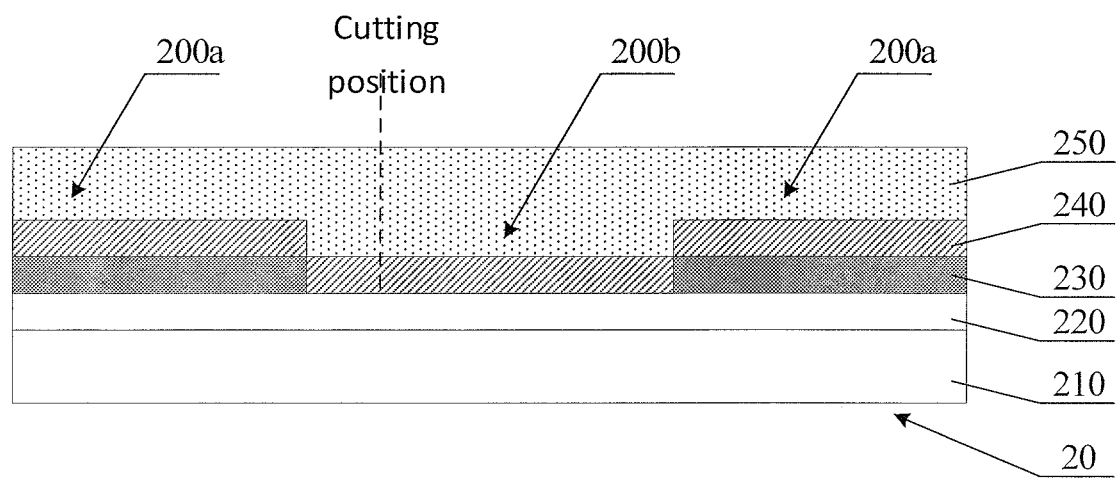
FIG. 1 is a schematic structural view of a flexible display apparatus in the related art.

The present disclosure will be described in further detail with reference to the accompanying drawings and embodiments in order to provide a better understanding by those skilled in the art of the technical solutions of the present disclosure. Throughout the description of the disclosure, reference is made to FIGS. 1-9. When referring to the figures, like structures and elements shown throughout are indicated with like reference numerals.

In the description of the specification, references made to the term "some embodiment," "some embodiments," and "exemplary embodiments," "example," and "specific example," or "some examples" and the like are intended to refer that specific features and structures, materials or characteristics described in connection with the embodiment or example that are included in at least some embodiments or example of the present disclosure. The schematic expression of the terms does not necessarily refer to the same embodiment or example. Moreover, the specific features, structures, materials or characteristics described may be included in any suitable manner in any one or more embodiments or examples.

Full screen and narrower frame have become a main direction of development for the display apparatus. How to realize opening of the display screen itself becomes a key technical challenge of the display apparatus. Take the OLED display apparatus as an example, a back panel of the OLED screen can be used to realize an opening through a mask patterning scheme. The light-emitting layer including an electroluminescence (EL) layer is a continuous unitary layer in the display apparatus, and needs be effectively covered by an encapsulation structure to ensure normal display of the display screen.

FIG. 1 is a schematic cross-sectional view of a flexible OLED display apparatus in the related art. As shown in FIG. 1, in the conventional flexible OLED display apparatus 20, a flexible substrate 220 is disposed on a rigid substrate 210, and the flexible substrate 220 has a display area 200a and a non-display area 200b. A Thin Film Transistor (TFT) array layer 230 is disposed in the display area 200a, and the non-display area 200b does not have the TFT Array layer 230. A light-emitting layer 240 (including an EL layer) and an encapsulation layer 250 are sequentially disposed on the TFT Array layer 230 of the display region 200a and the flexible substrate 220 of the non-display region 200b. For the conventional flexible OLED display device 200 shown in FIG. 1, if the opening is directly realized by a laser cutting, the portion of the non-display area 200b is cut and removed. Although only the non-display area 200b is cut, since the light emitting layer 240 is a continuous unitary layer between the display region 200a and the non-display region 200b, the cutting causes the EL layer in the luminescent layer 240 to be directly exposed to the air. However, the display apparatus needs to be effectively covered by the encapsulation structure to ensure normal display of the display screen. As such, the material of the EL layer may fail due to the entry of moisture.

Accordingly, one example of the present disclosure is a display substrate. As shown in FIG. 2, the display substrate may include a substrate. The substrate may include a display area 100a, a dummy area 100c inside the display area, and a boundary area 100d between the dummy area and the display area on the substrate. The display substrate may further include an isolation protrusion on the substrate at the boundary area. The isolation protrusion may be configured to isolate a functional layer in the display area from the functional layer in the dummy area. At least a side surface of the isolation protrusion facing the dummy area may be covered by an isolation inorganic layer.

FIG. 2 is a schematic structural diagram of a display panel according to one embodiment of the present disclosure. The display panel 100 provided in this embodiment is, for example, a panel of an OLED display apparatus. The display panel 100 may include a display area 100a and non-display areas 100b located inside and around the display area 100a. The non-display area includes a dummy area 100c inside the display area, and a boundary area 100d between the dummy area and the display area on the substrate. The substrate 110 of the display panel 100 is provided with isolation protrusions. The isolation protrusions 120 separate or isolate the functional layer 130 in the display area 100a from functional layer in the dummy area 100c.

In one embodiment, at least a side surface of the isolation protrusion facing the dummy area may be covered by an isolation inorganic layer. In one embodiment, the top surface and sidewalls of the isolation protrusion 120 are covered by an Atomic layer deposition (ALD) layer 140.

In the embodiment of the present disclosure, the dummy area 100c of the display panel 100 is an area where the opening is to be set. The functions of the opening area include, for example, one or more of the following: a camera, a sensor, a physical button, a frame of the display panel 100 of the display apparatus, and the like. The display panel 100 of the display apparatus is a monolithic structure during the manufacturing process. The opening inside the display panel 100 may be realized by a laser cutting process after the display apparatus is completed. As such, an internal opening of the display panel 100 is formed. This internal opening constitutes the dummy area 100c inside the display area 100a. In addition, in the manufacturing process of the display apparatus, a plurality of display apparatuses is usually fabricated on one large substrate. The large substrate is cut to form a plurality of display apparatuses after the fabrication is completed.

The isolation inorganic layer may be formed by atomic layer deposition. In one embodiment, the isolation protrusion includes a wall structure surrounding the dummy area. In another embodiment, the isolation protrusion includes a plurality of isolation columns surrounding the dummy area. A distance between two adjacent isolation columns may be in a range of about 30 μm to about 100 μm.

Figure 2A:
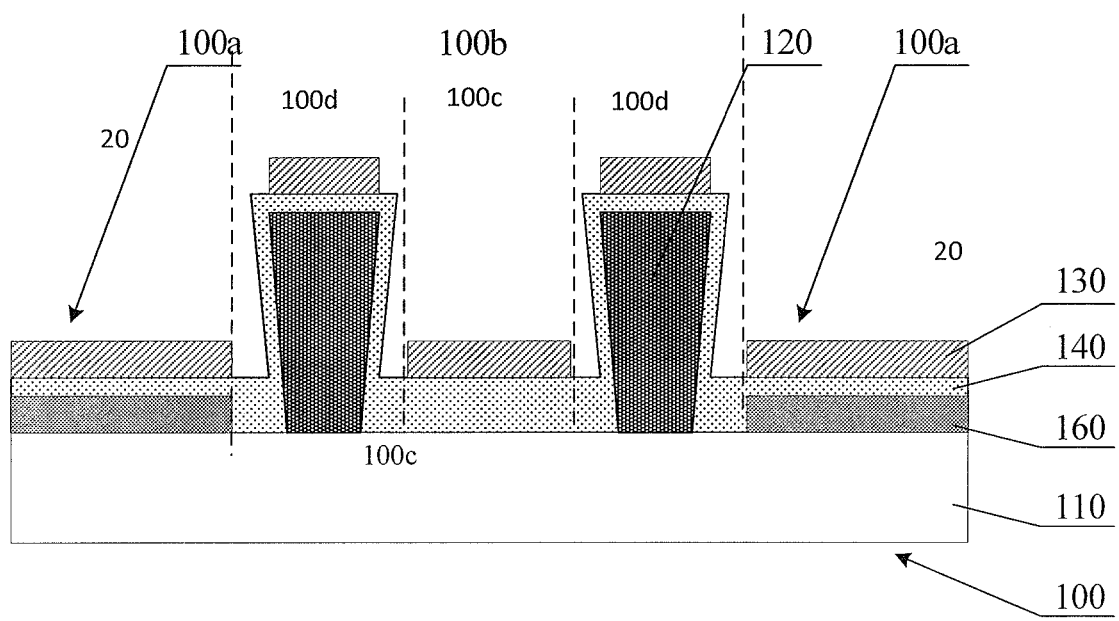
FIG. 2a is a schematic structural diagram of a display panel according to one embodiment of the present disclosure.

In one embodiment, as shown in FIG. 2a, an orthographic projection of the lower half of the isolation protrusion on the substrate may fall within an orthographic projection of the upper half of the isolation protrusion on the substrate. An area of a cross-section of the isolation protrusion in a plane parallel to the substrate may increase along a direction away from the substrate.

Figure 2B:
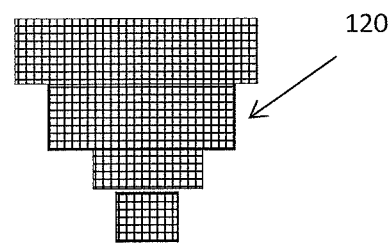
FIG. 2b shows a cross-section of an isolation protrusion in a plane perpendicular to the substrate according to one embodiment of the present disclosure.

In one embodiment, as shown in FIG. 2a a cross-section of the isolation protrusion in a plane perpendicular to the substrate may have an inverted trapezoidal structure. In one embodiment, as shown in FIG. 2b, a cross-section of the isolation protrusion in a plane perpendicular to the substrate may have a stepwise structure. The isolation inorganic layer may extend into at least a part of the display area.

In one embodiment, the isolation protrusion disconnects all functional layers including a light-emitting layer 133, a cathode 132, a capping layer 131 in the display area from those in the dummy area. The anode layer is located under the isolation inorganic layer.

Figure 2C:
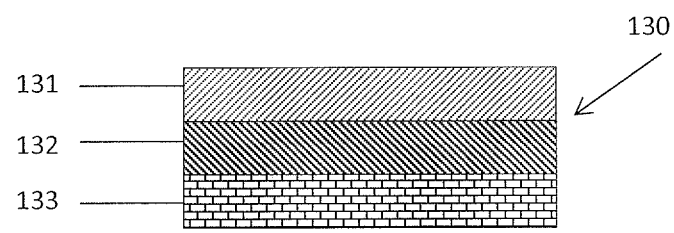
FIG. 2c is a schematic structural diagram of a functional layer according to one embodiment of the present disclosure.

In one embodiment, as shown in FIG. 2c, the functional layer may include at least one of a light-emitting layer, a cathode, or a capping layer. The function layer may be formed by an evaporation deposition technique. The light-emitting layer may further include an electron injection layer, an electron transport layer, a hole injection layer, and a hole transport layer.

The dummy area may include a hole or an opening area. A shortest distance from an edge of the hole to an edge of the display area may be in a range of about 0.5 mm to about 2 mm. The dummy area may be configured to install at least one selected from a group consisting of a camera, a sensor, and a physical button. The shape of the hole is not limited. In some embodiments, the hole may have a shape of a square, a rectangle, or a circle.

Figure 3:
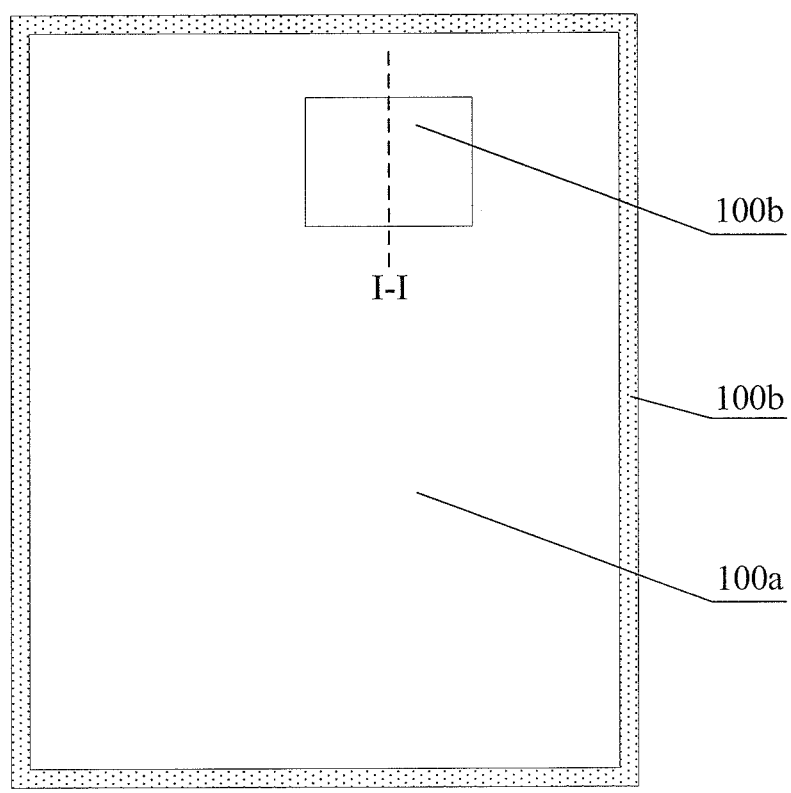
FIG. 3 is a schematic structural diagram of opening areas of a display screen in a display panel according to one embodiment of the present disclosure.

FIG. 3 is a schematic structural diagram of an opening area of a display screen in a display panel according to one embodiment of the present disclosure. The internal opening area shown in FIG. 3 is specifically the dummy area 100c inside the display area 100a, and the opening area of the display panel 100 is mainly concentrated inside the display area 100a. The periphery of the display panel 100 shown in FIG. 3 is the frame of the display screen, that is, the non-display area 100b outside the display area 100a. The structure shown in FIG. 2 is a cross-sectional view of the display panel 100 of FIG. 3 taken along line I-I.

The opening area shown in FIG. 3 is only a schematic representation of the openings in the display panel 100 provided by one embodiment of the present disclosure. The opening (non-display area 100b) inside the display panel 100 is not limited to the dummy areas 100c shown in FIG. 3. The locations and the number of dummy areas 100b may be different depending on product requirement of the display apparatus to which the display panel 100 belongs.

Comparing to the display apparatus of the prior art shown in FIG. 1, the display panel 100 provided by the embodiment of the present disclosure provides isolation protrusions 120. The isolation protrusions 120 separate the functional layer 130 in the display area 100a from the functional layer 130 in the dummy area 100b. When the display panel 100 is applied to an OLED display apparatus, the functional layer 130 has a multilayer structure, and the functional layer 130 may include an anode layer, a light-emitting layer, and a cathode layer. The embodiment of the present disclosure providing the isolation protrusions 120 which separate the functional layers 130, which are otherwise disposed continuously in a conventional display apparatus. Specifically, the functional layer 130 is separated by the isolation protrusion 120 at the boundary area between the display area 100a and the dummy area 100c. That is to say, the functional layer 130 in the opening area is isolated by the isolation protrusion 120 for subsequent opening processing, as shown in the structure shown in FIG. 2 and FIG. 3.

In one embodiment of the present disclosure, a TFT array layer 160 is further disposed between the functional layer 130 of the display area 100a and the substrate 110, and the TFT array layer 160 is used for controlling switch of light-emitting pixels in the functional layer 130 of the display area 100a. In addition, for the isolation protrusions 120 for isolating the functional layers 130 of different areas (i.e., the display areas 100a and the dummy areas 100c), their top surfaces and side walls are covered by the ALD layer 140. The ALD layer 140 has good cladding characteristics and can tightly cover the isolation protrusion 120. When the opening process is subsequently performed, for example, by cutting the dummy area 100c using a laser cutting, the functional layer 130 of the dummy area 100c may be partially exposed to the air. However, the functional layer 130 in the display area 100a is tightly encapsulated by the ALD layer 140 and the subsequent encapsulation layer, thereby preventing the display area 100a from falling due to encapsulation failure.

In the display panel 100 according to the embodiment of the present disclosure, the functional layers 130 including the light-emitting layer of the display area 100a are isolated from those of the dummy area 100c by the isolation protrusions 120 provided on the substrate 110 of the display panel 100. The top surface and side walls of the isolation protrusions are covered by the ALD layer 140. As such, the sidewalls of the functional layer 130 adjacent to the isolation protrusions 120 are encapsulated by the ALD layer 140. In the display panel 100 provided by the embodiment of the present disclosure, the isolation protrusions 120 are provided to separate the functional layers, which is otherwise continuously disposed as in the conventional display apparatus. In addition, the ALD layer 140 has good encapsulation characteristics and is capable of closely covering the isolation protrusion 120. As such, the functional layer 130 in the display area 100a is tightly encapsulated by the ALD layer 140 and the subsequent encapsulation slayer, thereby achieve excellent encapsulation effect and avoiding the problem that the display area 100a is degraded due to encapsulation failure.

In one embodiment, a cross-section of the isolation protrusion 120 in a plane perpendicular to the base substrate is an inverted trapezoidal structure, and the isolation protrusion 120 may be made of a polyimide (PI)). The isolation protrusion 120 in the embodiment of the present disclosure is actually disposed between the light-emitting pixel of the display area 100a and the dummy area 100c. The inverted trapezoidal structure is advantageous for the fabricating process. When the ALD layer 140 and the encapsulation layer are subsequently formed, the isolation protrusion 120 can be effectively covered, thereby ensuring effective encapsulation.

It should be noted that the display panel 100 in the embodiment of the present disclosure can be applied to a flexible display apparatus. In the flexible display apparatus, the substrate 110 can include a rigid substrate 111 and a flexible substrate 112. The flexible substrate 112 can be made of the PI material.

Figure 4:
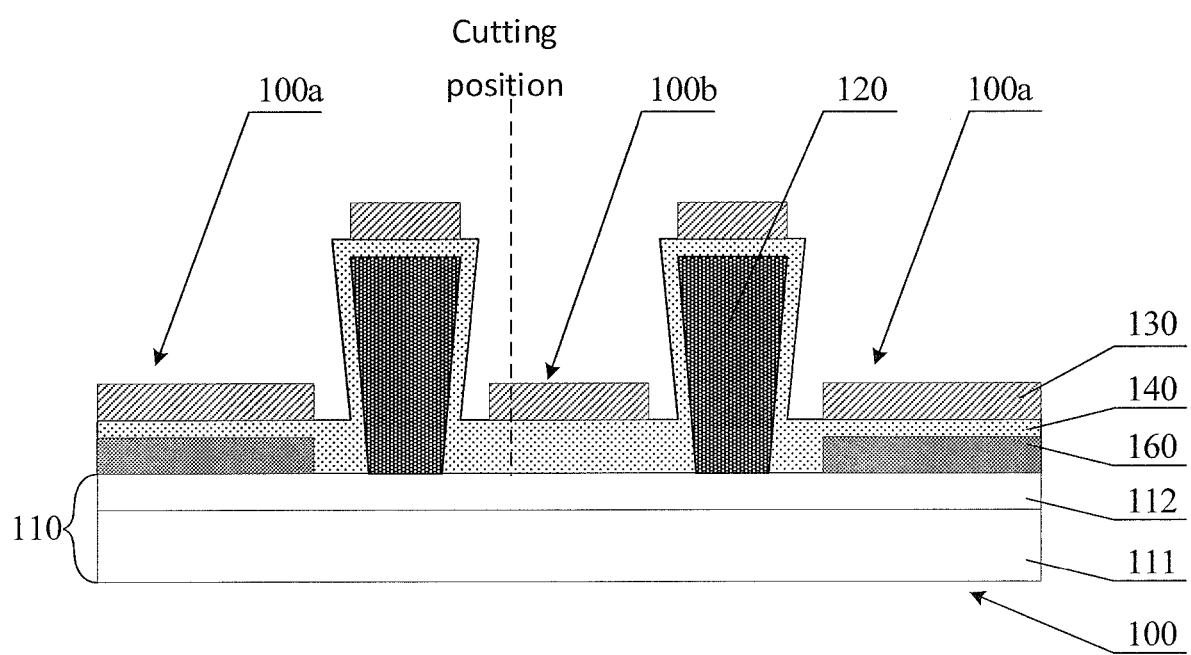
FIG. 4 is a schematic structural diagram of a display panel according to one embodiment of the present disclosure.

FIG. 4 is a schematic structural diagram of a display panel according to one embodiment of the present disclosure.

In one embodiment, the ALD layer 140 can be made of silicon oxide or aluminum oxide. When the ALD layer 140 is made of silicon oxide, for example, it may be SiOx. When the ALD layer 140 is made of alumina, for example, it may be aluminum oxide ($Al_2O_3$). The ALD layer 140 is generally selected from the materials having a water blocking effect to ensure that moisture is prevented from entering the display area 100a of the display panel 100 after the opening area (dummy area 100b) is cut. The thickness of the ALD layer can be, for example, about 30 nanometers (nm).

Figure 5:
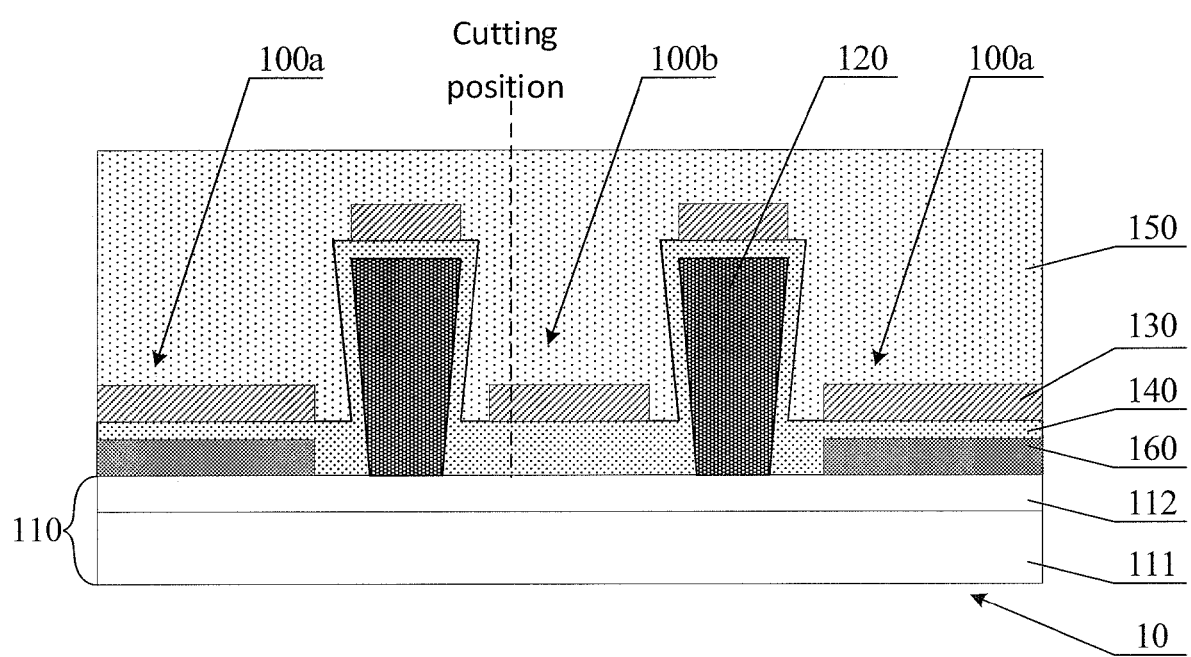
FIG. 5 is a schematic structural diagram of a display apparatus according to one embodiment of the present disclosure.

Another example of the present disclosure further provides a display apparatus including the display panel 100 provided by any of the above embodiments of the present disclosure. FIG. 5 is a schematic structural diagram of a display apparatus according to one embodiment of the present disclosure. The display apparatus 10 includes a display panel 100 in any of the embodiments shown in FIG. 2 to FIG. 4 and an encapsulation layer 150 disposed on the functional layers 130 of the display panel 100. The encapsulation layer 150 is used to protect the display component in the display apparatus 10. The display apparatus may include a TFT array layer 160 and a functional layer 130. FIG. 5 shows an example in which the display panel 100 shown in FIG. 4 is included in the display apparatus 10.

The display substrate may further include an encapsulation layer. The encapsulation layer may include a first inorganic layer, an organic layer, and a second inorganic layer. The first inorganic layer may cover at least the display area and the boundary area, the organic layer may cover at least the display area, and the second inorganic layer may cover at least the display area and the boundary area. An orthographic projection of the organic layer may fall within an orthographic projection of the first inorganic layer and an orthographic projection of the second inorganic layer.

Figure 6:
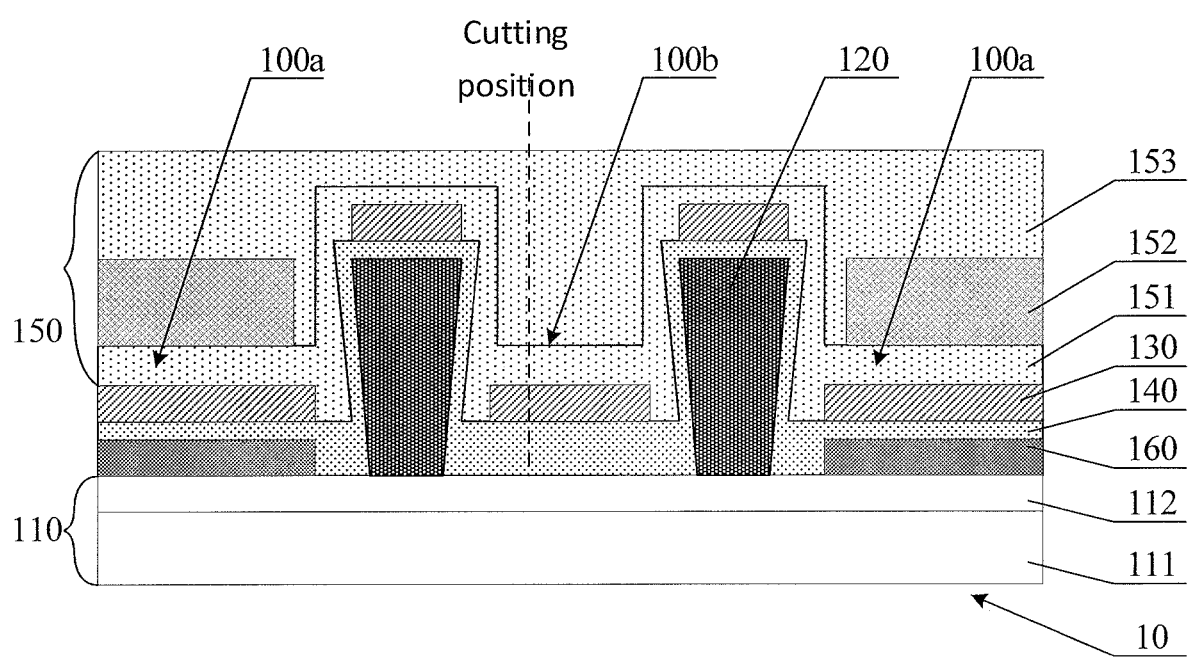
FIG. 6 is a schematic structural diagram of a display apparatus according to one embodiment of the present disclosure.

FIG. 6 is a schematic structural diagram of a display apparatus according to one embodiment of the present disclosure. In the display apparatus 10 according to the embodiment of the present disclosure, the encapsulation layer 150 may include a first inorganic layer 151, an organic layer 152, and a second inorganic layer 153. In one embodiment, the inorganic layer is also a chemical vapor deposition (CVD) layer, and the organic layer 152 is also referred to as an inkjet printing (IJP) layer 152.

In the practical application, the first inorganic layer 151 is disposed on the functional layers 130 of the entire display apparatus 10. The organic layer 152 is disposed on the functional layer 130 of the display area 100a. The second inorganic layer 153 fully covers the first inorganic layer 151 and the organic layer 152. As shown in FIG. 5, in the display apparatus 10 provided by the embodiment of the present disclosure, the encapsulation layer 150 is formed by CVD+IJP+CVD stacking. Furthermore, in the structure of the encapsulation layer 150, the water blocking effect is achieved by the CVD layers, that is, the first inorganic layer 151 and the second inorganic layer 153. The IJP layer (ie, the organic layer 152) has no water blocking effect. Therefore, in order to ensure that the side of the encapsulation layer 150 has an excellent water blocking effect, the IP layer (ie, the organic layer 152) may be retracted, that is, only cover the functional layer 130 of the display area 100a, and completely encapsulated by the second inorganic layer 153.

In one embodiment, in the pixel in the display area 100a adjacent to the isolation protrusion 120, the ALD layer 140 is disposed above the TFT array layer 160. As shown in the display panels 100 shown in FIGS. 2 and 4, and the display apparatuses 10 shown in FIGS. 5 and 6, at the position of the display am 100a close to the dummy area 100c, that is, the position of the isolation protrusion 120 close to the display area 100a, an upper portion of the TFT array layer 160 (i.e., the region near the isolation column 120) is covered by the ALD layer 140. That is, the light-emitting pixels in the TFT array layer 160 adjacent to the isolation protrusions 120 are completely covered by the ALD layer 140. Thus, the ALD layer 140 forms atomic-scale deposition on the above-mentioned several light-emitting pixels of the TFT army layer 160. As such, the ALD layer has good encapsulation properties, thereby further ensuring the encapsulation effect on the isolation columns 120.

In the display apparatus 10 provided by the embodiment of the present disclosure, the dummy area 100c may include one or more of the following: a camera, a sensor, a physical button of the display apparatus 10, a fame of the display screen, or the like. Generally, an opening area, that is, a dummy area 100c, may be reserved in the display apparatus for its internal hardware structure, for example, including the above-mentioned camera, sensor, physical button, etc. during the manufacturing process. In addition, during the manufacturing process, a plurality of display apparatuses is usually formed on a large substrate. After the manufacturing process is completed, the large substrate is cut to form each display apparatus. At this time, the frame of the display screen is cut, that is, the non-display area 100b around the display area 100a is formed.

Another example of the present disclosure further provides a method for fabricating the display apparatus, and the method for fabricating the display apparatus is used to manufacture the display apparatus provided by any of the above embodiments of the present disclosure.

The method of manufacturing a display substrate may include forming an isolation protrusion on a substrate of a display apparatus, the isolation protrusion being configured to isolate a display area from a dummy area inside the display area of the display apparatus, forming an isolation inorganic layer on a surface of the isolation protrusion facing the dummy layer, and forming a functional layer in the display area and the dummy area respectively. The isolation protrusion may isolate the functional layer in the display area from the functional layer in the dummy area.

The method of manufacturing a display substrate may further include forming an encapsulation layer on the functional layer of the display area and the functional layer of the dummy area. The encapsulation layer may include a first inorganic layer, an organic layer, and a second inorganic layer. The first inorganic layer may be formed by a chemical vapor deposition technique, the organic layer may be formed by an ink-jet printing technique, and the second inorganic layer may be formed by a chemical vapor deposition technique.

The method of manufacturing a display substrate may further include forming a hole in the dummy area by laser or mechanical force. A shortest distance from an edge of the hole to an edge of the display area may be in a range of about 0.5 mm to about 2 mm. A sensor, a camera, or a physical button may be installed in the hole.

The isolation inorganic layer may be formed on the surface of the isolation protrusion facing the dummy layer by an atomic deposition technique. The functional layer may be formed in the display area and the dummy area respectively by an evaporation deposition technique.

The isolation protrusion may be formed by a technique using negative photoresist, which includes steps of exposure, development, etching, and stripping.

Figure 7:
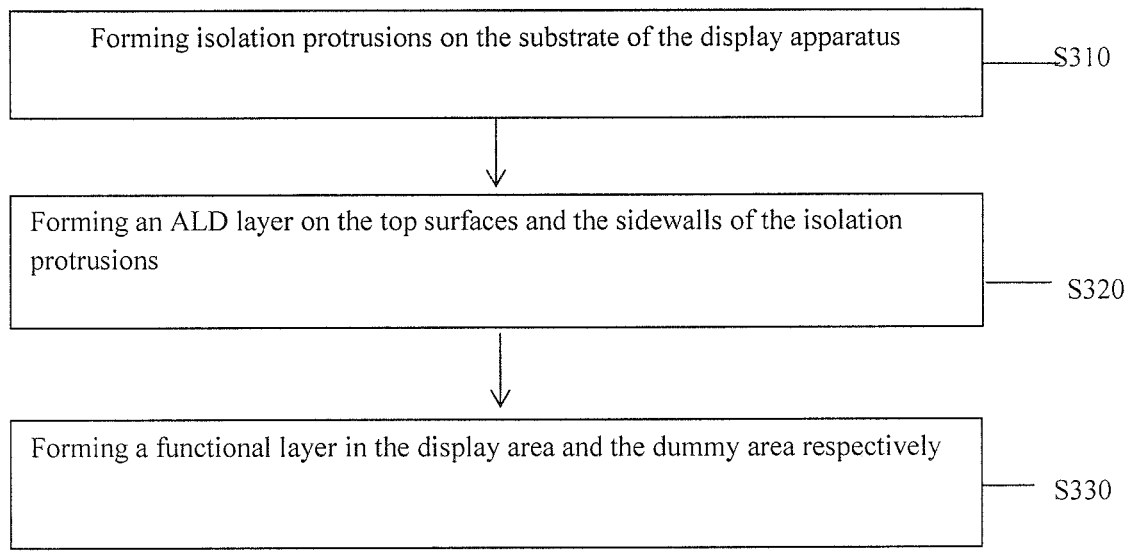
FIG. 7 is a flowchart of a method for fabricating a display apparatus according to one embodiment of the present disclosure.

FIG. 7 is a flowchart of a method for fabricating a display apparatus according to one embodiment of the present disclosure. The method provided in this embodiment may be applied to a process of manufacturing a display apparatus. The method provided by the embodiment of the present disclosure may include the following steps, namely, S310-S330:

In step S310, isolation protrusions are formed on the substrate of the display apparatus. The isolation protrusion is used to separate the display area from the dummy area of the display apparatus.

In the embodiment of the present disclosure, the dummy area of the display apparatus is an area where the opening is to be set. The opening area includes for example, one or more of the following: a camera, a sensor, a physical button of the display apparatus, and the like. The display screen of the display apparatus is a unitary structure during the manufacturing process. The opening inside the display apparatus may be formed by a laser cutting process after fabrication to form an internal opening of the display apparatus. This internal opening is the dummy areas inside the display area. In addition, in the manufacturing process of the display apparatus, a plurality of display apparatuses is usually fabricated on one large substrate. The one large substrate is cut after completion of the fabrication to form each display apparatus. At this time, the frame of the display screen, which is the non-display area around the display area, is formed.

FIG. 3 shows structure of the opening area according to one embodiment of the present disclosure. The internal opening area is specifically a dummy area inside the display area. The periphery of the display panel shown in FIG. 3 is a frame of the display screen, that is, a non-display area outside the display area.

In step S320, an ALD layer is formed on the top surfaces and the sidewalls of the isolation protrusions.

In step S330, a functional layer is formed in in the display area and the dummy area respectively. The functional layers between the display area and the dummy area are separated by the isolation protrusion.

In contrast to the conventional display apparatus shown in FIG. 1, a method for fabricating a display apparatus according to one embodiment of the present disclosure includes forming an isolation protrusion for separating a display area from a dummy area before a functional layer is formed subsequently. After the subsequent formation of the functional layers, the previously formed isolation protrusion separates the light-emitting layers in the display area and dummy area. The functional layer of the OLED display apparatus has a multi-layer structure, and the multi-layer structure of the functional layer can be formed by sequentially depositing a light-emitting layer, a cathode layer, and a capping layer by evaporation. Embodiments of the present disclosure provide an isolation protrusion in advance, which separates otherwise a continuously disposed functional layer as in a conventional display apparatus. Specifically, the functional layer at the boundary area between the display area and the dummy area is separated by the isolation protrusion. That is to say, the functional layer at the opening area is separated by the isolation protrusion for subsequent opening processing, as shown in FIG. 2 and FIG. 3.

In the embodiment of the present disclosure, the ALD layer may be formed on the top surface and the sidewalls of the isolation protrusion by deposition. The isolation protrusion for isolating the functional layers of different areas (ie, the display area and the dummy area) is covered by the ALD layer. The ALD layer has a good cladding feature and can closely cover the isolation protrusion. When the opening process is performed subsequently, for example, when the dummy area is cut by a laser cutting process, the functional layer of the dummy area may be partially exposed to the air. However, the functional layer in the display area may be closely sealed by the ALD layer and the encapsulation layer, thereby avoiding decrease of product yield due to encapsulation failure in the display area.

The manufacturing method of the display apparatus provided by one embodiment of the present disclosure provides forming isolation protrusions on the substrate of the display apparatus to separate the display area from the dummy area of the display apparatus. Then, an ALD layer is formed on the top surface and sidewalls of the isolation protrusion, and a functional layer is then formed respectively in the display area and dummy area. According to the manufacturing method of the display apparatus provided by one embodiment of the present disclosure, the functional layers in the display area and the dummy area of the display apparatus are separated by the isolation protrusion, and are no longer a continuous functional layer as in the conventional display apparatus. In addition, the formed ALD layer has good encapsulation characteristics and is capable of closely covering the isolation protrusion. As such, the functional layer of the display area is tightly encapsulated by the ALD layer and the subsequent encapsulation layer, thereby achieving excellent encapsulation effect and avoiding decrease of product yield due to encapsulation failure in the display area.

Figure 8:
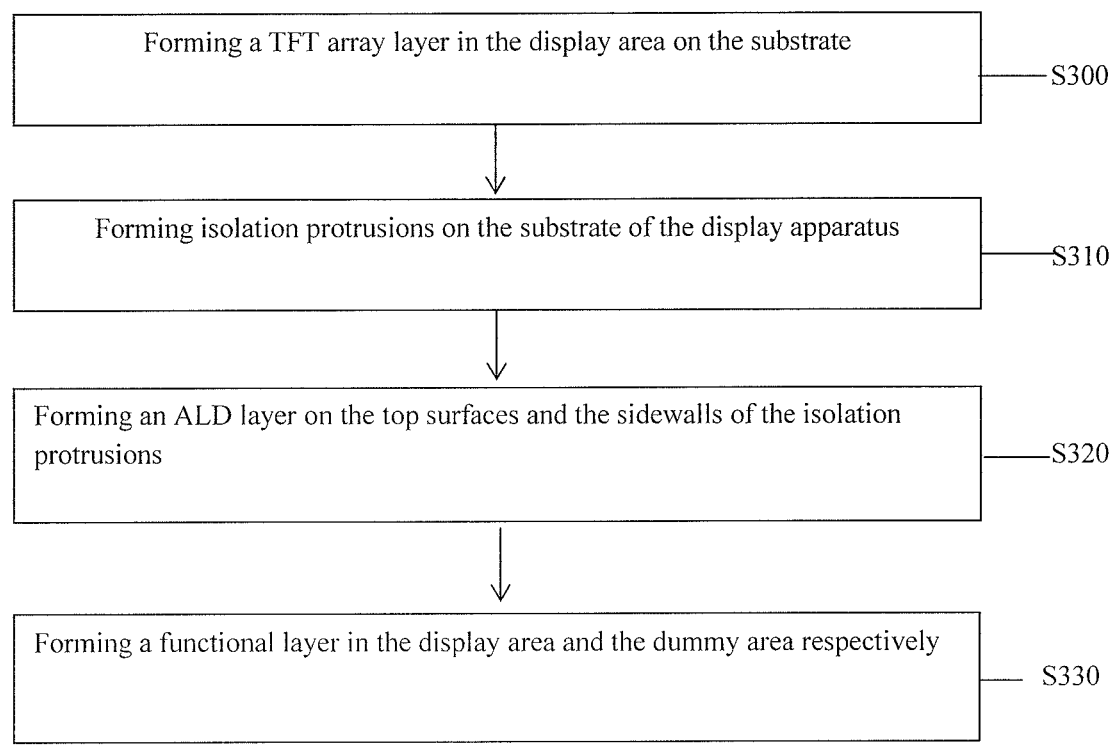
FIG. 8 is a flowchart of a method for fabricating a display apparatus according to one embodiment of the present disclosure.

FIG. 8 is a flowchart of a method for fabricating a display apparatus according to one embodiment of the present disclosure. On the basis of the embodiment shown in FIG. 7, the method provided by the embodiment of the present disclosure may further include the following steps before step S310.

In step S300, a TFT array layer is formed in the display area on the substrate.

The display apparatus in the embodiment of the present disclosure may also be a flexible display apparatus. In the flexible display apparatus, the substrate may include a rigid substrate and a flexible substrate, and the flexible substrate may be made of a PI material. The TFT array layer may be formed by patterning a surface of a flexible substrate using a mask. That is, the flexible substrate is patterned by coating, exposing, and developing to form a square hole or a circular hole, and the circuit of the opening area (non-display area) is bypassed. The TFT array layer in the embodiment of the present disclosure is used for controlling switching of the light-emitting pixels in the light-emitting layer of the display area.

In the manufacturing method provided by the embodiment of the present disclosure, the implementation manner of S310 may include forming an inverted trapezoidal isolation protrusion on the substrate at the boundary between the display area and the non-display area by a masking process.

The isolation protrusion in the embodiment of the present disclosure may include a wall structure. A cross-section of the isolation protrusion in a plane perpendicular to the base substrate may have an inverted trapezoidal structure, and the isolation protrusion may be made of a PI material. The isolation protrusion in the embodiment of the present disclosure is actually disposed between the light-emitting pixel of the display area and the dummy area 100c. The inverted trapezoidal structure is advantageous for the fabrication process. After the subsequent formation of the ALD layer and the encapsulation layer, the isolation protrusion can be well encapsulated or sealed to ensure the purpose of effective encapsulation.

In one embodiment, the ALD layer may be made of silicon oxide or aluminum oxide. When the ALD layer is made of silicon oxide, for example, it may be SiOx. When the ALD layer is made of alumina, for example, it may be aluminum oxide ($Al_2O_3$). The material of the ALD layer is usually selected from the materials having a water blocking effect to ensure that moisture is prevented from entering the display area of the display apparatus after the opening area (non-display area) is formed by cutting. In one embodiment, the ALD layer may be formed by a deposition process, and the thickness thereof may be, for example, about 30 nanometers (nm).

Figure 9:
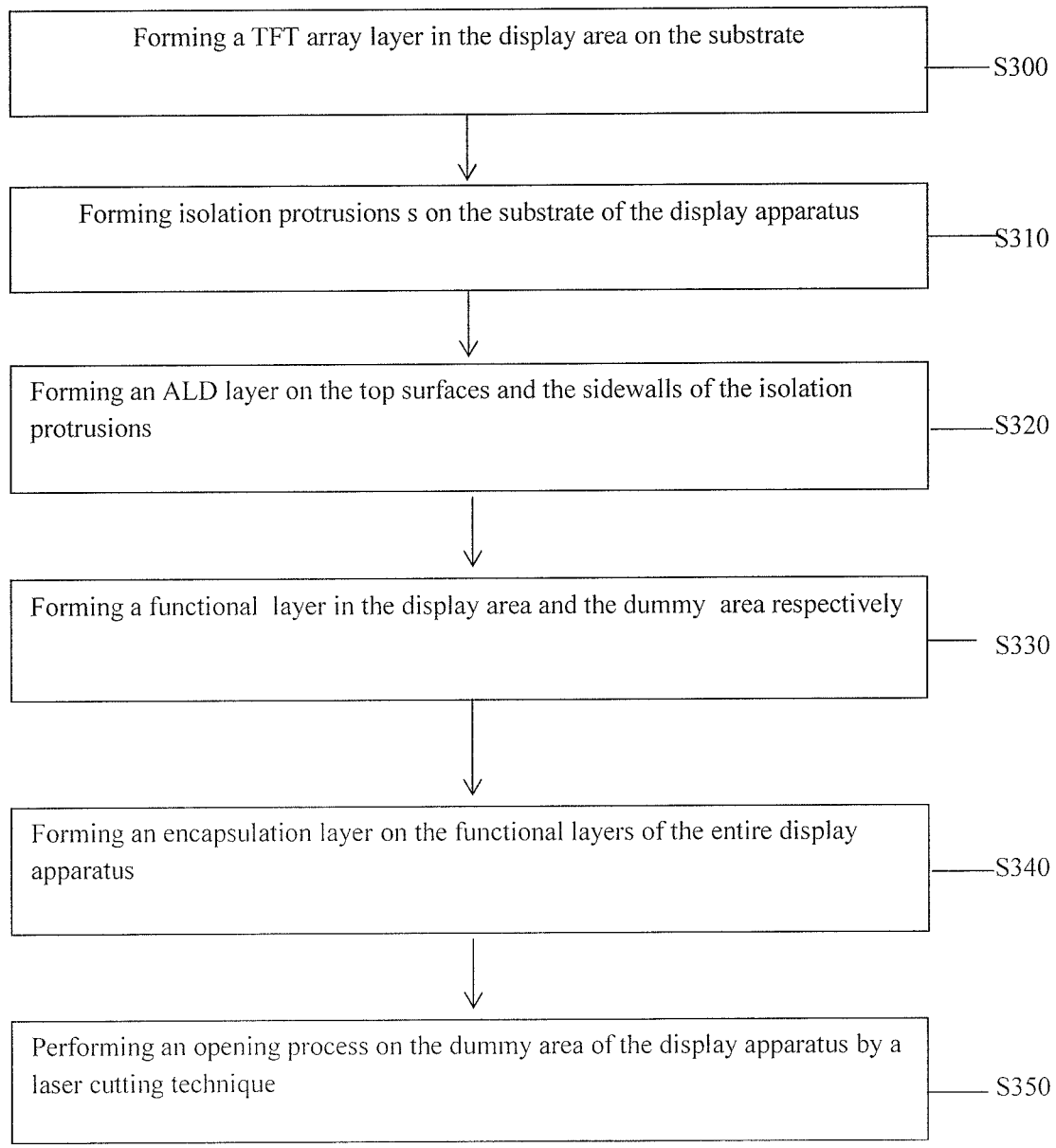
FIG. 9 is a flowchart of a method for fabricating a display apparatus according to one embodiment of the present disclosure.

FIG. 9 is a flowchart of a method for fabricating a display apparatus according to one embodiment of the present disclosure. On the basis of the embodiment shown in FIG. 8, the method provided by the embodiment of the present disclosure may further include the following steps after S330:

In step S340, an encapsulation layer is formed on the functional layers of the entire display apparatus. In one embodiment, the encapsulation layer includes a first inorganic layer, an organic layer, and a second inorganic layer.

In one embodiment, forming the encapsulation layer includes the following:

In step 1, a first inorganic layer is formed on the functional layers of the entire display apparatus.

In step 2, an organic layer is formed above the display area on the first inorganic layer.

In step 3, a second inorganic layer is formed on the first inorganic layer and the organic layer. The second inorganic layer fully covers the first inorganic layer and the organic layer.

According to the manufacturing method provided by the embodiment of the present disclosure, the first inorganic layer is located on the functional layers of the entire display apparatus, the organic layer is located on the functional layer in the display area, and the second inorganic layer fully covers the first inorganic layer and the organic layer. As shown in the structure of the display apparatus shown in FIG. 5, it can be seen that the display apparatus in the embodiment of the present disclosure has an encapsulation layer formed by CVD+IJP+CVD stacking. In the structure of the encapsulation layer, the water blocking effect is mainly due to the CVD layers, that is, the first inorganic layer and the second inorganic layer. The IJP layer (the organic layer) does not have water blocking effect. Therefore, in order to ensure that the side of the encapsulation layer has an excellent water blocking effect, the IJP layer (ie, the organic layer) can be retracted. That is, the IJP layer only covers the functional layer of the display area, and is completely covered by the second inorganic layer.

In one embodiment, when an ALD layer is formed on the top surface and sidewalls of the isolation protrusion by atomic layer deposition, the ALD layer is also formed on an upper surface of the TFT array layer of the pixel in the display area adjacent to the isolation protrusion. In one embodiment, the ALD layer may be a layer of SiOx (or $Al_2O_3$) deposited on a surface of a small area of the TFT array layer adjacent to the isolation protrusion. Referring to the display panel shown in FIG. 2 and FIG. 4, and the display apparatus shown in FIG. 5 and FIG. 6, in a display area close to the non-display area, that is, the area of the isolation protrusion close to the display area, a small area of the TFT array layer (ie, the area near the isolation protrusion) is covered by the ALD layer. That is, the light-emitting pixels in the TFT array layer close to the isolation protrusion are covered by the ALD layer. Since the ALD layer forms atomic-level deposition on the above-mentioned several light-emitting pixels of the TFT array layer, it has good encapsulation properties, thereby further ensuring the encapsulation effect on the isolation protrusion.

In one embodiment, the method according to one embodiment of the present disclosure includes the following:

In step S350, an opening process is performed on the dummy area of the display apparatus by a laser cutting technique.

In the display apparatus formed by the fabrication method of the above embodiment of the present disclosure, the functional layers in the display area and the dummy area are separated by the isolation protrusion, and both the functional layer and the isolation protrusion are tightly encapsulated by the ALD layer and the encapsulation layer having water blocking properties. Therefore, after the opening process is performed, that is, after the dummy area is cut, the functional layer of the display area is still tightly encapsulated by the ALD layer and the encapsulation layer, thereby achieving a good encapsulation effect and ensuring the yield of the product.

The principle and the embodiment of the present disclosures are set forth in the specification. The description of the embodiments of the present disclosure is only used to help understand the method of the present disclosure and the core idea thereof. Meanwhile, for a person of ordinary skill in the art, the disclosure relates to the scope of the disclosure, and the technical scheme is not limited to the specific combination of the technical features, and also should covered other technical schemes which are formed by combining the technical features or the equivalent features of the technical features without departing from the inventive concept. For example, technical scheme may be obtained by replacing the features described above as disclosed in this disclosure (but not limited to) with similar features.

What is claimed is:

1. A display substrate, comprising:
    a substrate, including
    a display area, a dummy area inside the display area, and a boundary area between the dummy area and the display area on the substrate; and
    an isolation protrusion on the substrate at the boundary area;
    wherein the isolation protrusion is configured to isolate a functional layer in the display area from the functional layer in the dummy area, and
    at least a side surface of the isolation protrusion facing the dummy area is covered by an isolation inorganic layer.

2. The display substrate of claim 1, wherein the functional layer comprises at least one of a light-emitting layer, a cathode, or a capping layer.

3. The display substrate of claim 1, wherein the isolation inorganic layer is formed by atomic layer deposition.

4. The display substrate of claim 1, wherein the isolation protrusion comprises a wall structure surrounding the dummy area.

5. The display substrate of claim 1, wherein the isolation protrusion comprises a plurality of isolation columns surrounding the dummy area and a distance between two adjacent isolation columns is in a range of about 30 µm to about 100 µm.

6. The display substrate of claim 1, wherein an orthographic projection of the lower half of the isolation protrusion on the substrate falls within an orthographic projection of the upper half of the isolation protrusion on the substrate.

7. The display substrate of claim 1, wherein an area of a cross-section of the isolation protrusion in a plane parallel to the substrate increases along a direction away from the substrate.

8. The display substrate of claim 1, wherein a cross-section of the isolation protrusion in a plane perpendicular to the substrate has an inverted trapezoidal structure.

9. The display substrate of claim 1, wherein the isolation inorganic layer comprises silicon oxide or aluminum oxide and the isolation protrusion comprises a polyimide material.

10. The display substrate of claim 1, wherein the isolation inorganic layer has a thickness in a range of about 10 nm to about 50 nm.

11. The display substrate of claim 1, wherein the isolation inorganic layer extends into at least a part of the display area.

12. The display substrate of claim 1, further comprising an encapsulation layer covering at least the display area and the boundary area, the encapsulation layer comprises a first inorganic layer, an organic layer, and a second inorganic layer, the first inorganic layer covers at least the display area and the boundary area, the organic layer covers at least the display area, and the second inorganic layer covers at least the display area and the boundary area, and an orthographic projection of the organic layer falls within an orthographic projection of the first inorganic layer and an orthographic projection of the second inorganic layer.

13. The display substrate according to claim 1, wherein the dummy area includes a hole, and a shortest distance from an edge of the hole to an edge of the display area is in a range of about 0.5 mm to about 2 mm.

14. A display apparatus, comprising the display substrate according to claim 1, wherein the dummy area is configured to install at least one selected from a group consisting of a camera, a sensor, and a physical button.

15. A method of manufacturing a display apparatus, comprising:
    forming an isolation protrusion on a substrate of the display apparatus, the isolation protrusion being configured to isolate a display area from a dummy area inside the display area of the display apparatus;
    forming an isolation inorganic layer on a surface of the isolation protrusion facing the dummy area; and
    forming a functional layer in the display area and the dummy area respectively,
    wherein the isolation protrusion isolates the functional layer in the display area from the functional layer in the dummy area.

16. The method of claim 15, further comprising forming an encapsulation layer on the functional layer of the display area and the functional layer of the non-display area, the encapsulation layer comprising a first inorganic layer, an organic layer, and a second inorganic layer,
    wherein the first inorganic layer covers at least the display area and the boundary area, the organic layer covers at least the display area, and the second inorganic layer covers at least the display area and the boundary area, and an orthographic projection of the organic layer falls within an orthographic projection of the first inorganic layer and an orthographic projection of the second inorganic layer.

17. The method of claim 16, wherein the first inorganic layer is formed by a chemical vapor deposition technique, the organic layer is formed by an ink-jet printing technique, and the second inorganic layer is formed by a chemical vapor deposition technique.

18. The method of claim 15, further comprising forming a hole in the dummy area by laser or mechanical force.

19. The method of claim 18, further comprising installing a sensor, a camera, or a physical button in the hole.

20. The method of claim 15, wherein the functional layer is formed in the display area and the dummy area respectively by an evaporation deposition technique.

* * * * *